(12) United States Patent
Koike et al.

(10) Patent No.: US 8,298,031 B2
(45) Date of Patent: Oct. 30, 2012

(54) ORGANIC ELECTROLUMINESCENCE DEVICE

(75) Inventors: Atsushi Koike, Kawasaki (JP); Mutsuo Mitsui, Tokyo (JP); Masahiro Kanai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 12/396,860

(22) Filed: Mar. 3, 2009

(65) Prior Publication Data

US 2009/0170393 A1 Jul. 2, 2009

Related U.S. Application Data

(62) Division of application No. 11/119,488, filed on May 2, 2005, now abandoned.

(30) Foreign Application Priority Data

May 7, 2004 (JP) ................................. 2004-138410

(51) Int. Cl.
*H01J 9/24* (2006.01)
(52) U.S. Cl. ........................................................ 445/24
(58) Field of Classification Search ............... 445/24–25; 313/495–497
See application file for complete search history.

(56) References Cited

U.S. PATENT DOCUMENTS

| | | | |
|---|---|---|---|
| 6,219,074 B1 | 4/2001 | Chosa et al. | 347/130 |
| 6,628,071 B1* | 9/2003 | Su | 313/512 |
| 2003/0122476 A1* | 7/2003 | Wang et al. | 313/493 |
| 2003/0146446 A1 | 8/2003 | Yamazaki et al. | 257/98 |
| 2003/0155612 A1* | 8/2003 | Kawachi et al. | 257/344 |
| 2003/0170496 A1 | 9/2003 | Hieda et al. | 428/690 |
| 2003/0201712 A1 | 10/2003 | Park et al. | 313/504 |
| 2003/0230795 A1* | 12/2003 | Yoshii et al. | 257/678 |
| 2004/0043637 A1 | 3/2004 | Aota et al. | 438/791 |
| 2004/0115859 A1* | 6/2004 | Murayama et al. | 438/99 |
| 2004/0201348 A1* | 10/2004 | Anandan | 313/512 |
| 2004/0265508 A9* | 12/2004 | Burrows et al. | 428/1.1 |
| 2005/0176181 A1* | 8/2005 | Burrows et al. | 438/127 |

FOREIGN PATENT DOCUMENTS

| | | |
|---|---|---|
| JP | 10-305620 | 11/1998 |
| WO | WO 98/53644 | 11/1998 |

* cited by examiner

*Primary Examiner* — Anh Mai
*Assistant Examiner* — Hana Featherly
(74) *Attorney, Agent, or Firm* — Fitzpatrick, Cella, Harper & Scinto

(57) ABSTRACT

The present invention provides an excellent organic EL device with a glass substrate and a sealing glass sheet which are thinned for weight reduction while avoiding lowering the durability and impact resistance of the device. The organic luminescence device is characterized in that sealing is performed at the space between a face of the sealing glass sheet along the outer edge and a face of the device substrate with a low melting point metal.

2 Claims, 2 Drawing Sheets

ORGANIC ELECTROLUMINESCENCE DEVICE

CROSS-REFERENCE TO RELATED APPLICATIONS

This application is a division of application Ser. No. 11/119,488, filed May 2, 2005, which is incorporated herein by reference.

BACKGROUND OF THE INVENTION

1. Field of the Invention

The present invention relates to a thin, light-weight organic electroluminescence device which has excellent durability and is impact-resistant.

2. Related Background Art

Display devices using electroluminescence (hereinafter abbreviated as EL) materials can be made thinner and lighter in weight than conventional CRTs, and are being applied to more and more various uses. Since cellular phones, portable information terminals and the like have obtained Internet connections, there is a drastic increase in amount of graphically displayed information, which raises the demand for display panels to display in color and high definition.

For display devices that are mounted to portable information terminals and the like, being light-weight is considered to be more important. On the cellular phone market, for example, there are products that weigh less than 70 g. Almost all parts employed including individual electronic parts, casings, and batteries are reviewed to make a portable information terminal or the like lighter in weight. However, in order to achieve further weight reduction, display devices, too, have to be lighter in weight.

Display devices in general are made using glass substrates. One way to reduce the weight of display devices is to make the glass substrates thinner. A thinner glass substrate, however, increases the flexibility of a display device in which the substrate is used, and causes the display device to warp easily when a slight force is applied. The warping, in some cases, instantly separates the glass substrate away from a sealing glass sheet that constitutes the display device together with the glass substrate. The separation generates high voltage (electrostatic charge induced by the separation, which can cause a breakdown of the display device or a driving TFT that drives the display device. Decrease in impact resistance is fatal for cellular phones. It is therefore an important subject how a glass substrate should be bonded to a sealing glass sheet in order to achieve weight reduction and impact resistance at the same time. A technique of enclosing a light transmissive portion with glass or transparent resin has been proposed in, for example, Japanese Patent Application Laid-Open No. H10-305620.

Self-luminous display devices for full-color display can be produced from organic EL materials. However, organic EL devices have various confirmed degradation mechanisms, which are obstacles to practical applications and urgent problems to be solved. Heat, light, moisture, oxygen, etc. fasten degradation of an EL layer in an organic EL device.

A common material used for a cathode to cause an organic EL layer to emit light is alkaline metal or alkaline earth metal which is low in work function. It is a known fact that the metal is very reactive with oxygen or water and is easily oxidized. When a cathode which injects electrons into an organic EL layer is oxidized, the material of the cathode loses electrons. Also, an oxide film is formed on the oxidized cathode material. The reduction in number of electrons and influences due to the oxide film are thought to lower the luminance of light emitted from the EL layer.

Dark spots are dot defects in a pixel portion which fail to emit light, and considered a problem that seriously lowers the display quality. Dark spots are progressive defects and are said to increase in number even when EL devices are not in operation if moisture is present. The cause of dark spots is thought to be the oxidization reaction of a cathode formed of alkaline metal or alkaline earth metal. The current countermeasure against dark spots is to enclose an organic EL device and add a desiccating agent thereto.

Those many factors that lead to oxidization, including low heat resistance of organic EL devices and heat which may cause further oxidization, present great obstacles to practical applications of organic EL devices.

Thus, while being very effective for weight reduction and thinning of display devices, employing a thinner glass substrate and sealing glass sheet leaves problems to be solved in order to ensure the reliability of organic EL devices.

SUMMARY OF THE INVENTION

The present invention relates to a technique that solves those problems, and an object of the present invention is to provide a highly reliable organic EL device.

Therefore, the present invention provides an organic electroluminescence device including an organic luminescence element portion having a pair of electrodes and an organic conductive layer placed between the pair of electrodes, and a substrate carrying the organic luminescence element portion thereon, comprising a sealing member covering the organic luminescence element portion, wherein no adhesive as an interstitial object is provided on a surface at which the sealing member and the organic luminescence element portion are in contact with each other, and wherein a low melting point metal fixes the sealing member to the substrate along an outer periphery of the sealing member.

In further aspect of the organic electroluminescence device, a passivation layer containing at least silicon is placed between the sealing member and the substrate.

In further aspect of the organic electroluminescence device, a laminated structure of a passivation layer containing at least silicon and a moisture absorption layer is placed between the sealing member and the substrate.

The present invention can provide an excellent organic EL device (organic electroluminescence device) with a glass substrate and a sealing glass sheet which are thinned for weight reduction while avoiding lowering the durability and impact resistance of the device.

DETAILED DESCRIPTION OF THE PREFERRED EMBODIMENTS

Figure 1:
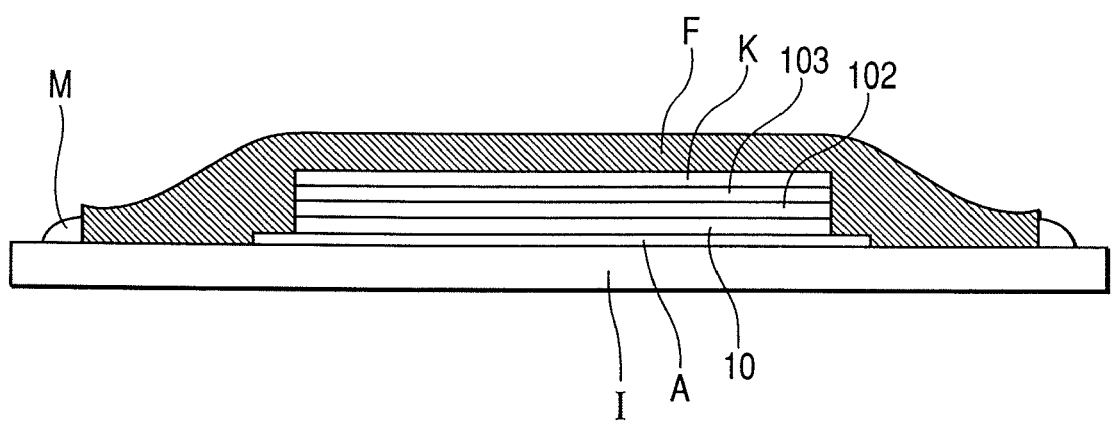
FIG. 1 is a schematic diagram showing a laminated structure of a luminescence device of the present invention.

The present invention relates to an organic electroluminescence device including an organic luminescence element portion having a pair of electrodes and an organic conductive layer placed between the pair of electrodes, and a substrate carrying the organic luminescence element portion thereon, comprising a sealing member covering the organic luminescence element portion, wherein no adhesive as an interstitial object is provided on a surface at which the sealing member and the organic luminescence element portion are in contact with each other, and wherein a low melting point metal fixes the sealing member to the substrate along an outer periphery of the sealing member.

In the organic electroluminescence device, a passivation layer containing at least silicon is placed between the sealing member and the substrate.

In the organic electroluminescence device, in which a laminated structure of a passivation layer containing at least silicon and a moisture absorption layer is placed between the sealing member and the substrate.

The present invention provides a self-luminous display device with a glass substrate where the device is formed and a sealing glass sheet serving as a cover member for enclosure. In the self-luminous display device according to the present invention, the glass substrate is joined to the sealing glass sheet in a reduced pressure atmosphere without fixing them with an adhesive, which contains a large amount of moisture, or the like. A space between a face along the outer edge of the sealing glass sheet and a glass substrate face is enclosed in the reduced pressure atmosphere with an sealing member formed from a low melting point metal material to thereby remove moisture and oxygen and other gases that can cause degradation of the device as much as possible from the enclosed space. The enclosed space kept in this state is completely shut off of the outside with the use of a low melting point metal material.

The glass substrate and the sealing glass sheet are joined to each other in a reduced pressure atmosphere in order to utilize, for press-fit, the difference in pressure between the sealing atmosphere pressure and the normal pressure (1 atm.), which is used environment, without using an adhesive of a large water content or the like. Usually, when the dew point of a reduced atmosphere pressure under operation is 80° C. or lower, the operating pressure is around 1/10 atm to 1/100 atm, so that exposure for a few minutes does not raise a problem. While a manufacturer may choose, if possible, to employ a method capable of fixing a sealing glass sheet and a glass substrate to each other in an atmospheric pressure environment without the fear of separation, a reduced pressure atmosphere that does not reduce to take generation of bubbles into consideration is preferable from the viewpoint of manufacturing technique.

In the case where an organic EL material that is particularly responsive to moisture is used, a layered (or non-layered) moisture absorbent may be placed in advance on the device substrate. A preferable absorbent is of the type that chemically reacts with moisture to keep absorbed moisture inside and never release, and that maintains its solid state after absorbing moisture. Absorbent examples that meet the requirements include, alkaline metal oxides, alkaline earth metal oxides, sulfates, metal halides, perchlorates, and organic substances.

The low melting point metal material in the above refers to indium (melting point: 157° C.), tin (melting point: 232° C.), or thallium (melting point: 271° C.), or alloys thereof. How the wettability with a glass surface is enhanced is particularly important in sealing using the low melting point metal material. One way to enhance the wettability satisfactorily while preventing the element portion of the glass substrate from reaching a temperature of 100° C., at which device characteristics are adversely affected, or higher, is to dispense the low melting point metal material melted by applying ultrasonic waves over the enclosed portion while the glass substrate and the sealing glass sheet are heated at 70 to 80° C.

There is no particular limitation on the material of the sealing glass sheet. However, taking into account slightly remaining moisture in the glass even after a dehydration process and the possibility of long-term exposure to high temperature and high humidity, it is desirable to form a passivation film from silicon nitride or silicon oxynitride on the face inside the enclosed space. The passivation film prevents degradation of the device due to the diffusion of moisture, ious, etc. from the glass. When the passivation film is a silicon nitride film, it is enough to take about 50 to 100 nm in film thickness. In order to enhance the short wavelength transmittance, a silicon oxynitride film with a thickness of about 100 to 200 nm is employed as the passivation film.

Now, an embodiment of the present invention will be described in detail with reference to the accompanying drawings. First, reference symbols in the drawings are explained.

| | |
|---|---|
| '1' | denotes a glass substrate. |
| 'A' | represents an anode. |
| '101' | denotes a hole-transporting layer. |
| '102' | denotes a luminescence layer. |
| '103' | denotes an electron injection layer. |
| 'K' | represents a cathode. |
| 'F' | represents a sealing glass sheet. |
| 'M' | represents a low melting point metal sealing material. |
| '2' | denotes a gate electrode. |
| '3' | denotes a gate insulating layer. |
| '4' | denotes a semiconductor layer. |
| '5' | denotes an interlayer insulating film. |
| '9' | denotes another interlayer insulating film. |
| 'D' | represents a drain. |
| 'S' | represents a source. |

FIG. 1 is a sectional view showing the basic structure of a top emission type organic EL device according to the present invention.

The organic EL device is composed of an anode A, a cathode K, and an organic EL layer 10 held between the two. The organic EL layer 10 contains a luminescence layer 102, which emits light when holes supplied from the anode A are recombined with electrons supplied from the cathode K. The organic EL layer 10 also contains a hole-transporting layer 101 and an electron injection electrode layer 103.

A description is given on a sealing glass sheet F and the low melting point metal sealing material M, which are features of the present invention. Soda lime glass or other materials that have satisfactory visible light transmittance can basically be used for the sealing glass sheet F. The thinner the sealing glass sheet F, the lighter the device weighs. However, a too thin glass sheet makes it difficult to handle. It is therefore preferable for the sealing glass sheet F to have a thickness of about 0.1 to 0.5 mm.

The low melting point metal sealing material M is preferably made from one of indium (m, melting point: 157° C.), tin (Sn, melting point: 232° C.), and thallium (Tl, melting point: 271° C.), which are not poisonous and which are air-stable, or alloys thereof. In these three metals may be added such elements as lithium (Li, melting point: 179° C.), sodium (Na, melting point: 98° C.), potassium (K, melting point: 64° C.), cesium (Cs, melting point: 29° C.), gallium (Ga, melting point: 30° C.), and rubidium (Rb, melting point: 39° C.), which cannot be used alone. The sealing member performs sealing at the space between a face along the edge of the sealing glass sheet and a glass substrate face by bringing the glass substrate and the glass sheet enclosure into close contact with each other. Since the present invention does not take the conventional organic EL device structure in which an adhesive is sandwiched between the glass substrate and the sealing glass sheet, the cross-sectional area of a path through which moisture and oxygen and other gases permeate from the outside of the device is greatly reduced. This and the fact that the present invention employs a metal sealing member of very low gas permeability in place of an organic adhesive ensure substantially complete air-tightness. After the sealing process, owing to the difference in the pressure inside the device and the atmospheric pressure, the glass substrate and the sealing glass sheet do not separate from each other when warped a little in an atmospheric pressure environment. The glass substrate and the sealing glass sheet remain tightly fit to each other and thus the impact resistance is improved.

The anode A desirably has a large work function. For instance, gold (Au), platinum (Pt), chromium (Cr), palladium (pd), selenium (Se), iridium (Ir), and copper iodide, and alloys thereof can be employed for the anode A.

Organic compounds that can be used for the hole-transporting layer 101 include, but not limited to, triphenyl diamine derivatives, oxadiazole derivatives, polyphyrin derivatives, and stilibene derivatives.

Examples of organic compounds that can serve as the material of the luminescence layer 102 include triarylamine derivatives, stillbene derivatives, polyarylenes, aromatic condensed polycyclic compounds, aromatic heterocyclic compounds, aromatic condensed heterocyclic compounds, and metal complex compounds, and single or complex oligomers thereof. One or more kinds of the above luminescent materials may be used to dope a hole injection layer, a hole-transporting layer, or an electron-transporting layer. The luminescence layer 102 of the present invention is not limited to the above materials configurations.

For the electron injection electrode layer 103, organic compounds doped with carbonates including cesium carbonate and lithium carbonate are suitable. A known example of such organic compounds is $Alq_3$. Iuorganic mixed layers are also applicable, for which layers Lif etc. can be employed.

A magnetron sputtering apparatus is preferably employed to form the cathode K by deposition. Specifically, transparent conductive film materials such as ITO and IWO arranged in the same deposition space are used as targets to form a transparent conductive film containing H on a device substrate in an atmosphere of a gas mixture of Ar, $O_2$ and $H_2O$ by intense magnetic field sputtering (target surface horizontal magnetic field: 1200 G). During the deposition, the flow rate of $H_2O$ gas is lowered toward the end of the deposition time. Alternatively, a concentration gradient of H is created in the film thickness direction of the cathode K by increasing the power applied to the transparent conductive film targets. Other than magnetron sputtering, a deposition method using an electron gun, an ion plating method using a plasma gun may be employed to form the cathode K by deposition.

Any thin film forming method can be employed to form the hole-transporting layer 101, the luminescence layer 102, and the electron injection electrode layer 103. Options include deposition, sputtering, CVD, molecular beam epitaxy (MBE), dipping, spin coating, casting, bar coating, and roll coating. Preferably, a deposition apparatus that uses resistance heating or Knudsen cells is employed. Co-deposition in which a dopant and an organic compound are simultaneously heated and deposited is suitable for forming the electron injection layer.

Figure 2:
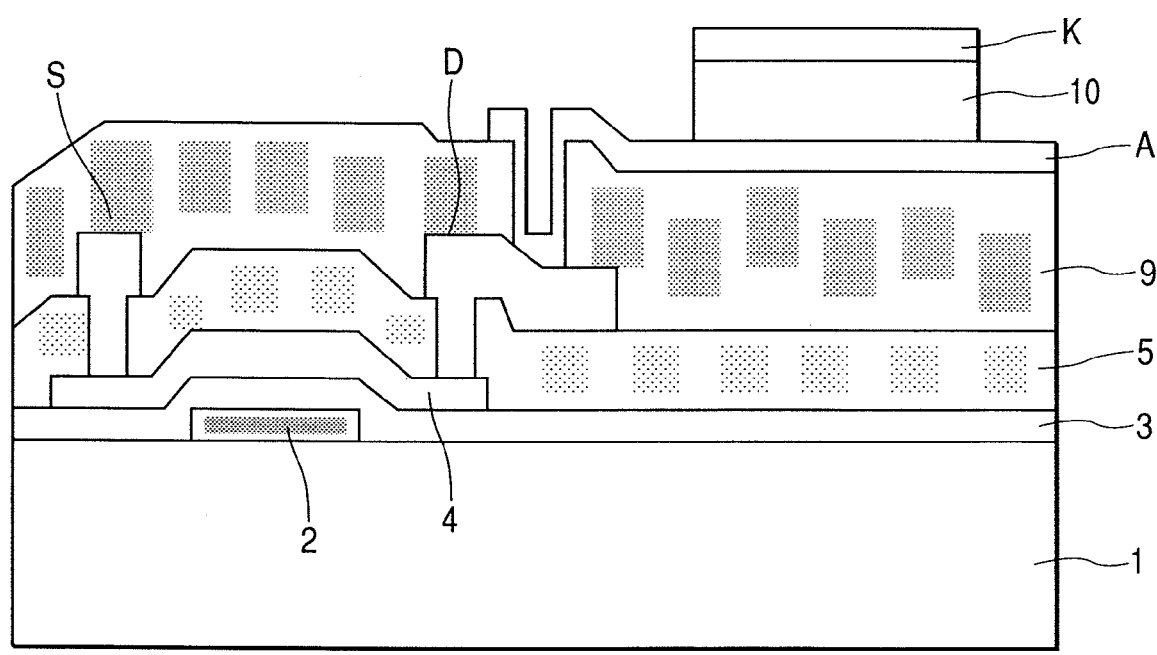
FIG. 2 is a schematic diagram showing in section a device structure of the present invention which includes an organic EL pixel and a part of a TFT.

FIG. 2 schematically shows the cross-sectional structure of a TFT substrate used in manufacture of an organic EL device which includes a part of an organic EL pixel and a TFT. A luminescent pixel portion is obtained by laying the anode A, the organic EL layer 10, and the cathode K on top of one another in this order. The anode A is independently provided for each pixel. The anode A is formed of Cr, for example, and is basically reflective. The cathode K is shared between pixels, and is basically light-transmissive. The TFT is composed of a gate electrode 2, which is formed on a substrate 1 composed of glass or the like, a gate insulating film 3, which is overlaid on a top face of the gate electrode 2, and a semiconductor thin film 4, which is placed above the gate electrode 2 with the gate insulating film 3 interposed between 2 and 4. The semiconductor thin film 4 is, for example, a polycrystalline silicon thin film. The TFT also has a source S, a channel Ch, and a drain D which serve as passages of a current supplied to the pixel electrode. The TFT, having the bottom gate structure, is covered with a interlayer insulating film 5, on which the source electrode S and the drain electrode D are formed. Another interlayer insulating film 9 is placed on the source and drain electrodes, and the pixel electrode (anode A) is formed on the interlayer insulating film 9.

Described below are Examples of the present invention.

EXAMPLE 1

Formation of a Cr Electrode

DC sputtering was conducted using a Cr target on a glass substrate to form as an anode A a Cr film to a thickness of 100 nm. A deposition mask was used during the sputtering to obtain a striped pattern of 3-mm stripes. The sputtering employs Ar gas and was conducted at a pressure of 0.2 Pa and a discharge power of $2.5\ W/cm^2$.

Formation of an Insulating Layer

Reactive DC sputtering was conducted using a Si target over a portion on the Cr electrode pattern that was to be enclosed, to thereby form as an insulating layer (not shown in the drawing) a SiNx film to a thickness of 200 nm. The SiNx film was to prevent a low melting point metal sealing material from short-circuiting the Cr electrode upon sealing. The reactive DC sputtering used a deposition mask to pattern the film. The reactive DC sputtering employed Ar and $N_2$ gas, and was conducted at a flow rate ratio of $Ar:N_2=2:1$, a pressure of 0.2 Pa, and a discharge power of $6.5\ W/cm^2$.

Exposure to Air

Next, the substrate was taken out of the sputtering apparatus, and was subjected to ultrasonic cleaning with acetone and then isopropyl alcohol (IPA). The ultrasonic cleaning was followed by washing in boiling IPA and drying, and further UV/ozone cleaning.

Pre-Treatment

The substrate was moved into an organic EL deposition apparatus, which was then exhausted until a vacuum state was obtained. In a pre-treatment chamber, an RF power of 50 W was applied to a ring-shaped electrode near the substrate to conduct an oxygen plasma cleaning process. The oxygen pressure was set to 0.6 Pa, and the process time was set to 40 seconds.

Formation of a Hole-transporting Layer

The substrate was moved from the pre-treatment chamber to a deposition chamber, which was exhausted until a pressure of $1 \times 10E^{(-4)}$ Pa was reached. Thereafter, αNPD capable of transporting holes was deposited by resistance heating deposition at a deposition rate of 0.2 to 0.3 nm/sec to form the hole transporting layer 101 with a thickness of 35 nm. The hole-transporting layer 101, the luminescence layer 102, and the electron injection layer 103 were deposited on a given portion with the use of the same deposition mask. The given portion was a portion on the substrate where Cr was exposed (pixel electrode).

Formation of a Luminescence Layer

On the hole-transporting layer 101, $Alq_3$ which is an alkylate complex was deposited by resistance heating deposition under the same deposition conditions that have been employed to form the hole-transporting layer 101. The $Alq_3$ film had a thickness of 15 nm which serves as the luminescence layer 102.

Formation of an Electron Injection Electrode Layer

Formed on the luminescence layer 102 by resistance heating deposition was the electron injection layer 103 with a thickness of 35 nm. The electron injection layer 103 was composed of an $Alq_3$ layer and a cesium carbonate ($Cs_2CO_3$) layer. The deposition rates of the materials were adjusted such that the thickness ratio of the $Alq_3$ layer and the cesium carbonate layer became 9:1. Specifically, the materials set in their respective deposition boats were deposited by resistance heating while the deposition rate of the organic layer was set lower than 5 A/S and the overall deposition rate of the co-deposition layer was set lower than 5 A/S by adjusting the current values of the boats.

Formation of a Cathode (Transparent Conductive Film)

The substrate was moved to another deposition chamber where an ITO target was used to form the cathode K with a thickness of 130 nm on the electron injection layer 103 by DC magnetron sputtering. The DC magnetron sputtering used a mask so that the Cr pixel electrode was covered and the cathode K intersected the Cr stripes.

As described above, since a magnet capable of creating a strong magnetic field was placed on the backside of the ITO target, low voltage sputtering could be performed.

The cathode K was formed by room temperature deposition, in which the substrate was not heated, at a deposition pressure of 1.0 Pa. The deposition employed Ar and $O_2$ gas of which flow rates were set to 500 sccm and 5.0 sccm, respectively. A discharge power of 500 W was applied to the ITO target. The transmittance was 85% (at 450 nm) and the specific resistivity was $8.0 E^{-4}$ $\Omega$cm.

Seal

The substrate was lastly moved to a glove box having an $N_2$ atmosphere with a dew point controlled to −80 to −85° C. A sealing glass sheet made of soda lime glass and having a thickness of 0.3 mm (the sealing glass sheet has already been dehydrated at 120° C. for 120 min in a glove box atmosphere) was joined to the substrate. In this state, the pressure in the glove box was reduced to 1000 Pa by a vacuum pump. Then at the space between a face along the edge of the sealing glass sheet and a glass substrate face sealing was performed with indium by a sealing robot equipped with an ultrasonic solder iron.

Device Evaluation

The anode A, the hole-transporting layer 101, the luminescence layer 102, the electron injection electrode layer 103, and the cathode K were thus formed on the glass substrate and a sealing process was performed to obtain a luminescence device.

a) Durability Characteristics: the obtained luminescence device was subjected to a 23-hour accelerated endurance test under a constant current with the Cr electrode as an anode A, the transparent conductive film as a cathode K, and with the current density set to 100 A/cm². The durability of the device was expressed in percentage how much the luminance was lowered after 23 hours from the initial luminance of 100% ('−' means a reduction, '+' means an increase). The results are shown in Table 1.

b) Impact Resistance: a device for an impact test was manufactured. The layer structure, deposition conditions of the layers, and sealing conditions that were employed for the test device were identical to those shown in FIG. 1 and described above, except for the deposition mask. In the test device, one 50×150 μm luminescent portion was formed at the center of a 45×55 mm glass substrate, a 35×45 mm sealing glass sheet was joined onto the top of the luminescent portion and the face along the edge of the sealing glass sheet was sealed. Five samples of such devices were manufactured, and each of them was fixed and housed in a plastic case (50×90× 25 mm, partially metal) that weighed 80 g. The case was dropped from a 2-m height onto an urethane foam mat having a thickness of 50 mm. Each device was dropped five times while emitting light, and then dropped five more times while emitting no light to check whether the device operated normally after having been dropped ten times in total. Dropping in this manner ten times total made one set. Ten sets were carried out until the device broke, and the set at which the device was broken was used as an indicator of the impact resistance of the device (if a device is broken at the end of the fifth set, the indicator is "5"). Of the five devices, the average value of the middle three devices excluding the smallest indicator and the largest indicator was calculated. The result is shown in Table 1.

EXAMPLE 2

Two types of luminescence devices are manufactured under the same conditions as Example 1 except that the low melting point metal sealing material was made of tin. The thus obtained devices are evaluated for durability characteristics and impact resistance in the same manner employed in Example 1. The result is shown in Table 1.

COMPARATIVE EXAMPLE 1

Two types of luminescence devices were manufactured under the same conditions as Example 1 except that the sealing atmosphere was changed to a normal pressure $N_2$ atmosphere (dew point: −80 to −85° C.) from the reduced pressure environment. The thus obtained devices were evaluated for durability characteristics and impact resistance in the same manner employed in Example 1. The result is shown in Table 1.

EXAMPLE 3

Formation of a Passivation Film

A passivation film (not shown in the drawing) with a thickness of 100 nm was formed on a face of the sealing glass sheet that was nearer toward the EL device by conducting reactive DC sputtering using a Si target (sealing glass sheet/SiNx/ cathode/organic layer/anode/glass substrate). The passivation film prevents deterioration of the device due to the diffusion of moisture ions, etc. from the sealing glass sheet. The deposition employed Ar and $N_2$ gas, and was conducted at a flow rate ratio of $Ar:N_2=2:1$, a pressure of 0.2 Pa, and a discharge power of 6.5 W/cm².

The thus obtained devices were evaluated for durability characteristics and impact resistance in the same manner employed in Example 1. The result is shown in Table 1.

EXAMPLE 4

Formation of a Moisture Absorption Layer

It is practically impossible to completely remove water molecules from the interior of the device during the sealing process no matter how low the moisture pressure in the sealing atmosphere is. In order to deal with a small amount of moisture permeated, a moisture absorption layer (not shown in the drawing) was formed in advance on the cathode K by sputtering (sealing glass sheet/SiNx/SrO/cathode/organic layer/anode/glass substrate). The moisture absorbing film was an SrO film, which was obtained by subjecting an $SrO_2$ target to RF sputtering, and by setting the flow rate of Ar to 20 sccm, the pressure to 0.45 Pa, and the discharge power to 2.5 $W/cm^2$.

Two types of luminescence devices were manufactured under the same conditions as Example 3 except that the moisture absorption layer was added in advance. The thus obtained devices were evaluated for durability characteristics and impact resistance in the same manner employed in Example 1. The result is shown in Table 1.

COMPARATIVE EXAMPLE 2

Two types of luminescence devices were manufactured under the same conditions as Example 4 except that the sealing atmosphere was changed to a normal pressure $N_2$ atmosphere (dew point: −80 to −85° C.) from the reduced pressure environment, and that an adhesive layer was formed in advance on the sealing glass sheet. The adhesive layer was formed from a two-pack epoxy adhesive which cures at room temperature to a thickness of 10 μm on SiNx by spin coating (sealing glass sheet/SiNx/adhesive layer/SrO/cathode/organic layer/anode/glass substrate). The thus obtained devices were evaluated for durability characteristics and impact resistance in same the manner employed in Example 1. The result is shown in Table 1.

TABLE 1

| | Durability (%) ([post-endurance test luminance]/initial luminance) | Impact Resistance |
| --- | --- | --- |
| Example 1 | −9 | •11 |
| Example 2 | −10 | •11 |
| Comparative Example 1 | −9 | 5.7 |
| Example 3 | −3 | •11 |

TABLE 1-continued

| | Durability (%) ([post-endurance test luminance]/initial luminance) | Impact Resistance |
| --- | --- | --- |
| Example 4 | −5 | •11 |
| Comparative Example 2 | −27 | •11 |

As is obvious from Table 1, the luminescence devices of the present invention exhibit remarkable durability despite having no adhesive between the glass substrate and the sealing glass sheet. In addition, the passivation layer and the moisture absorption layer have recognizable effects. Table 1 clearly shows the effectiveness of the reduced pressure sealing atmosphere in terms of impact resistance, suggesting that adhesion force effectively acts between the glass substrate and the sealing glass sheet.

This application claims priority from Japanese Patent Application No. 2004-138410 filed May 7, 2004, which is hereby incorporated by reference herein.

What is claimed is:

1. A process for producing an organic electroluminescence device, comprising, in sequence, the steps of:
    (a) forming an organic luminescence element portion on a substrate;
    (b) dehydrating a sealing glass sheet; and
    (c) sealing the organic luminescence element portion by overlapping the organic luminescence element portion with the sealing glass sheet such that the organic luminescence element portion and the sealing glass sheet are in direct contact,
    wherein the sealing step is conducted under a reduced pressure atmosphere and comprises the sub-steps of:
    (c-i) directly contacting the substrate and the sealing glass sheet with each other at a periphery of the sealing glass sheet; and thereafter
    (c-ii) fixing the sealing glass sheet to the substrate with a low melting point metal applied along an outer edge of the sealing glass sheet and an adjoining surface of the substrate.

2. The process according to claim 1, wherein the sealing glass sheet has a thickness of 0.1 to 0.5 mm, and the reduced pressure atmosphere of the sealing step is 1/10 atm to 1/100 atm.

* * * * *